United States Patent [19]
Murphy

[11] Patent Number: 4,743,875
[45] Date of Patent: May 10, 1988

[54] CIRCUIT BREAKER HAVING A DIRECT CURRENT MEASURING SHUNT

[75] Inventor: William J. Murphy, Monroeville, Pa.

[73] Assignee: Westinghouse Electric Corp., Pittsburgh, Pa.

[21] Appl. No.: 888,306

[22] Filed: Jul. 22, 1986

[51] Int. Cl.⁴ .................. H01H 73/00; H01H 73/12; H01H 75/00; H01H 83/06

[52] U.S. Cl. ........................................ 335/18; 335/6; 335/41

[58] Field of Search ................... 335/18, 41, 42, 6, 16, 335/176; 324/424, 126, 105, 106; 361/102, 115

[56] References Cited
U.S. PATENT DOCUMENTS
4,584,545  4/1986  Nagel .................................. 324/424

Primary Examiner—E. A. Goldberg
Assistant Examiner—Lincoln Donovan
Attorney, Agent, or Firm—L. P. Johns

[57] ABSTRACT

A circuit breaker having a direct current measuring shunt characterized by a molded insulating housing having line and load terminals with two conductors extending between the terminals, a current measuring sensor between overlapping end portions of the conductors and having a laminated structure of two outer conductor blocks and an intermediate body of an electrically resistance alloy having opposite sides brazed to corresponding facing sides of the blocks, each conductor block having an electrical terminal connected to a measuring millivolt surface for measuring the volt differential across the body.

2 Claims, 2 Drawing Sheets

CIRCUIT BREAKER HAVING A DIRECT CURRENT MEASURING SHUNT

BACKGROUND OF THE INVENTION

1. Field of the Invention

This invention pertains to a current measuring shunt that can be mounted inside a molded case circuit breaker, and more particularly it pertains to a 2 millivolt output signal at rated DC current as well as to a compressed mounted shunt.

2. Description of the Prior Art

A solid state trip unit for a direct current circuit breaker requires a sensor that has an output proportional to the current flowing through the breaker. A meter shunt is a common device for measuring DC current and in the past have comprised a 2-inch long ribbon of an electrically resistance alloy for a 50 millivolt drop at rated current.

Due to the limited amount of space it would be impossible to mount a standard meter shunt inside a molded case circuit breaker. Moreover, the power dissipated in a 50 millivolt meter shunt would be in excess of that permitted inside a molded case circuit breaker.

SUMMARY OF THE INVENTION

In accordance with this invention a circuit breaker having a direct current measuring shunt is provided which comprises a housing having line and load terminals, conductor means extending between the terminals and including a pair of conductors having adjacent end portions, a circuit breaker structure supported in the housing and including a pair of separable contacts for opening and closing an electric circuit in the conductor means, a releasable mechanism, manually operable means manually operable only when the releasable mechanism is in a latched position to open and close said contacts, trip means operating automatically in response to overload current conditions above a predetermined value to release the releasable mechanism whereupon said releasable mechanism automatically moves from said latched position to a trip position to open the contacts, the manually operable means being operable to move the releasable mechanism from the trip position to the latched position following release of the releasable mechanism, the current measuring sensor including a laminated body having first and second conductors and an intermediate element composed of an electrically resistance alloy having a resistivity coefficient of from about 100 nΩ·m to about 1500 nΩ·m, a temperature coefficient of resistance of from about −50 ppm/°C. to about +50 ppm/°C., and a thermoelectric potential versus copper of about −1.5 μV/°C. to about +1.5 μV/°C. the intermediate element being metallurgically bonded to opposite sides of the first and second conductors, the first and second conductors being electrically connected to an electronic metering circuit for measuring the millivolt drop across the intermediate element, the adjacent end portions of the pair of conductors overlapping and the current measuring sensor being disposed between the overlapping end portions in good electrical contact therewith, the first and second conductor block consisting of a metal selected from the group consisting of aluminum, copper, gold, platinum, and silver, the intermediate element of the electrically resistance alloy being a copper base alloy including at least one metal selected from the group consisting of manganese and nickel, the metallurgical bond between the intermediate element and the first and second conductor blocks being a brazing alloy of high silver content, each conductor block comprising a potential terminal near the intermediate element which terminals are electrically connected to the electronic measuring circuit, the current measuring sensor being compression mounted between the first and second conductors, and the surface of the sensor being coated with an oxide preventive material.

The advantage of the current measuring sensor of this invention is that it can be mounted inside a molded case circuit breaker and has only a fraction of the power dissipation of a standard meter shunt. Another advantage of the current measuring sensor of this invention is that it can be calibrated before mounting it in the circuit breaker.

DESCRIPTION OF THE PREFERRED EMBODIMENT

Figure 1:
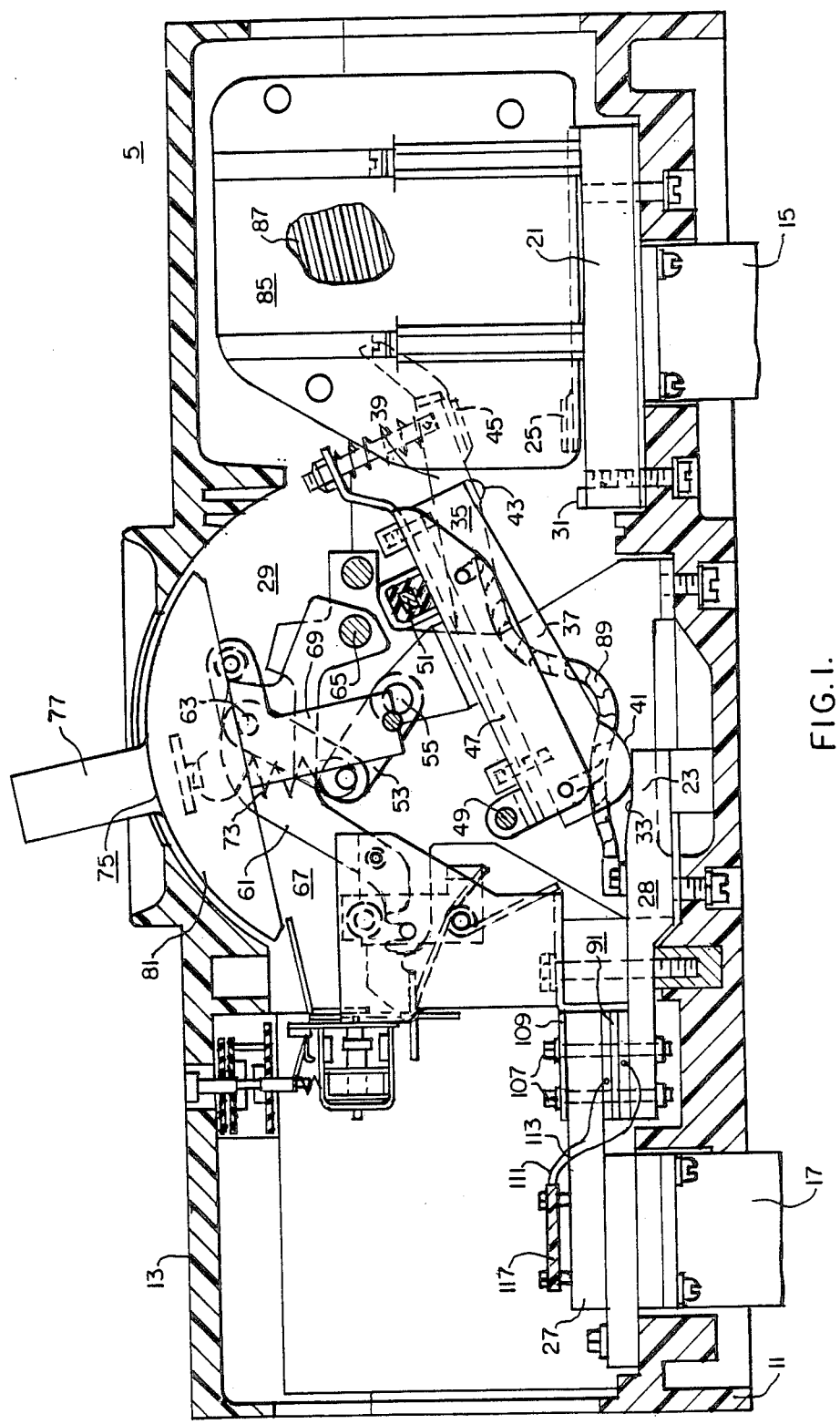
FIG. 1 is a vertical sectional view, with parts broken away through the center pole of a three-pole circuit breaker.

In FIG. 1 a three-pole molded case or insulating housing type circuit breaker is generally indicated at 5 and it comprises an insulating housing comprising a molded insulating base 11 and a molded insulated cover 13. Suitable insulating barrier means separate the housing 11, 13 into three adjacent insulating compartments for housing the three pole units of the three-pole circuit breaker in a manner well-known in the art, such as shown in U.S. Pat. No. 3,826,951. In each pole unit, two terminals 15 and 17 are provided at openings in the base 11 in proximity to the opposite ends of the housing to enable connection of the circuit breaker in an electric circuit.

In each of the three-pole unit compartments of the circuit breaker, there are two conductors 21 and 23 suitably secured to the base 11. The terminal 15 is secured to the flat under surface of the conductor 21. A stationary contact 25 is fixedly secured to the front of the conductor 21. A rigid main conductor 27 is mounted on the base 11 and connected, at one end thereof, to the conductor 23. The other terminal 17 is connected to the flat undersurface of the conductor 27.

A single stored-energy type operating mechanism 29, for controlling all three-pole units is mounted in the center pole unit compartment of the circuit breaker. In addition to the stationary contact 25, there is a stationary contact 31 mounted on the conductor 21 and a stationary contact surface 33 on the conductor 23 in each pole unit of the circuit breaker. The operating mechanism 29 is operable to move a movable contact structure indicated generally at 35 between open and closed positions. The movable contact structure 35 is of the type more specifically described in the U.S. Pat. No. 3,662,134. The movable contact structure 35 comprises a plurality of main bridging contact arms 37 and an arcing contact arm 39. Each of the main bridging contact arms 37 comprises a contact surface 41 cooperable with the stationary contact surface 33 and a contact 43 cooperable with the contact 31. The arcing contact arm 39 comprises a contact 45 cooperable with the stationary contact 25. The contact structure 35 is supported on a contact carrier 47 that is supported for pivotal movement about a pivot pin 49.

A rigid insulating tie bar 51 extends across all three pole units and is connected to the three contact carriers 47 to simultaneously move the three contact carriers 47 between open and closed positions. The contact carrier 47, for the center pole unit, is pivotally connected to a lower toggle link 53 by means of a pivot pin 55. The lower toggle link 53 is pivotally connected to an upper toggle link 57 by means of a knee pivot pin 59. The upper toggle link 57 is pivotally connected to a releasable trip member 61 by means of a pivot pin 63. The releasable trip member 61 is supported at on end thereof for pivotal movement about a fixed pivot pin 65. The releasable trip member 61 is latched, at the other end thereof, by means of a latch structure 67. An inverted generally U-shaped operating lever 69 is supported at the inner ends of the legs thereof for pivotal movement on a pair of fixed pins 71. Tension springs 73 are connected at the lower ends thereof to the knee pivot 59 and at the upper ends thereof to the bight portion of the operating lever 69.

A handle structure 75 is connected to the front end of the operating lever 69 and comprises a handle part 77 that extends out through an opening 79 in the front of the cover 13. The handle structure 75 comprises a shroud 81 that substantially closes the opening 79 in all positions of the handle structure 75. In each pole unit, an arc-extinguishing structure 85, comprising a plurality of generally U-shaped magnetic plates 87 supported in a spaced stacked relationship. The arc-extinguishing structure 85 operates to extinguish arcs drawn between the contacts 25, 45 during opening operations in a manner well-known in the art.

In each pole unit, the arcing contact arm 39 is electrically connected to the conductor 23 by means of a flexible conductor 89. In the closed position of the contacts, the circuit, through each pole unit, extends from the terminal 17 through the conductor 27, the conductor 23, the movable contact structure 35, the conductor 21, to the other terminal 15. The main bridging contact arms 37 carry most of the current in the closed position of the contacts, and the current path through these contact arms extends from the contact surfaces 33, through the contacts 41, the bridging contact members 37, the contacts 43, to the contact 31. During opening operations, the main bridging the contacts 43, 31 separate first and thereafter, the current is carried from the conductor 23 through the flexible conductor 89, the arcing contact arm 39, the arcing contact 45 and the arcing contact 25. When the arcing contact arm 39 separates an arc is drawn between the contacts 25, 45 and extinguished in the arc-extinguishing structure 85 in a manner well-known in the art.

The circuit breaker is shown in FIG. 1 in the open position with the releasable trip member 61 latched in the latched position shown by means of the latch mechanism 67. To close the circuit breaker, the handle 77 is moved in a clockwise direction from the OFF or open position to the ON or closed position to move the operating lever 69 clockwise about the pivot 71. During this movement, the overcenter springs 73 are moved over center to erect the toggle 53, 57 to thereby pivot the movable contact structure 35 of the center pole unit in a clockwise direction about the pivot 49 to the closed position. With the three contact carriers 47 being connected for simultaneous movement by means of the tie bar 51, this movement serves to simultaneously move all three of the movable contact structures to the closed position.

To manually open the circuit breaker, the handle 77 is moved counterclockwise to the off position seen in FIG. 1. This moves the springs 73 over center to cause collapse of the toggle 53, 57 to thereby move the contact structures 35 to the open position illustrated. Each of the contact carriers 47 and movable contact structures 35 moves about the associated pivot pin 49 with all of the contact carriers and movable contact structures moving about a common axis between the open and closed positions.

When the circuit breaker is in the closed position and an overload occurs in any of the three-pole units, the releasable member 61 will be released, in a manner to be hereinafter described, to automatically trip the circuit breaker open. Upon release of the releasable member 61, the springs 73, which are in a charged condition, rotate the trip member 61 in a clockwise direction about the pivot 65 to cause collapse of the toggle 53, 57 to thereby move the three contact carriers 47 and movable contact structures 35 to the open position. Upon tripping movement of the circuit breaker, the handle 77 is moved to an intermediate position in between the "OFF" and "ON" positions to provide a visual indication that the circuit breaker has tripped open.

Following a tripping operation, it is necessary to reset and relatch the circuit breaker mechanism before the contacts can be closed. Resetting and relatching is achieved by moving the handle 77 to a position past the "OFF" position. During this movement, a pin member 91 on the member 69 engages a shoulder portion 93 on the releasable member 61, and the releasable member 61 is moved down to a position to relatch the latch structure 67 in a manner to be hereinafter described. Following relatching of the latch structure 67, when the operator releases the handle 77 the releasable member 61 will again be reset and relatched in the position seen in FIG. 1. Thereafter, the circuit breaker can be operated in the same manner as was hereinbefore described.

The operation of the latch structure 67 together with associated parts is set forth in the above-mentioned U.S. Pat. No. 3,826,951 which is incorporated herewith by reference.

When the contacts 31, 43 are closed, a circuit through the circuit breaker extends from the terminal 15 through the several parts 21, 31, 43, 37, 87, 28, a current measuring sensor 91, the conductor 27 to the terminal 17.

In accordance with this invention the current measuring sensor 91 is disposed (FIG. 1) between overlapping portions of the conductors 27, 28. As shown more particularly in FIGS. 2 and 3, the sensor 91 is a rectangular, laminated body including conductors 93, 95 and an element 97 disposed therebetween. The conductors 93, 95 are preferably blocks of metal having high coefficients of electrical conductivity, such as metal selected from the group consisting of aluminum, copper, gold, platinum, and silver. The conductors 93, 95 are preferably composed of copper.

The element 97 is a relatively thin, or ribbon-like, member disposed between the conductors 93, 95. The element 97 is an electrically resistant alloy having a resistivity of about 100 nΩ·m to about 1500 nΩ·m. The preferred resistivity is about 480 nΩ·m. In addition, the element 97 has a temperature coefficient of resistance of from about −50 ppm/°C. to about +50 ppm/°C. The preferred temperature coefficient of resistance is about ±15 ppm/°C. between 40° C. and 60° C. The element 97 has a thermoelectric potential vs. copper from about −1.5 to +1.5 μV/°C. The preferred coefficient is about ±1 μV/°C.

The element 97 is an electrically resistant material and preferably a copper-base alloy including at least one metal selected from the group consisting of manganese and nickel. The manganin alloys are preferred, such as the manganin alloy having 83% copper, 13% manganese, and 4% nickel are used. Other materials, such as the nickel-base alloys are suitable, a typical composition of which includes 57% copper and 43% nickel. For further details of these alloys reference is made to Metals Handbook, 9th edition, Vol. 3 of the American Society for Metals, copyright 1980, page 640, entitled "Electrical Resistance Alloys". The copper conductors 93, 94 are brazed to the intermediate element 97 by using a high silver content brazing alloy. Brazing layers 99, 101 are indicated in the cross-sectional view of FIG. 3.

Figure 2:
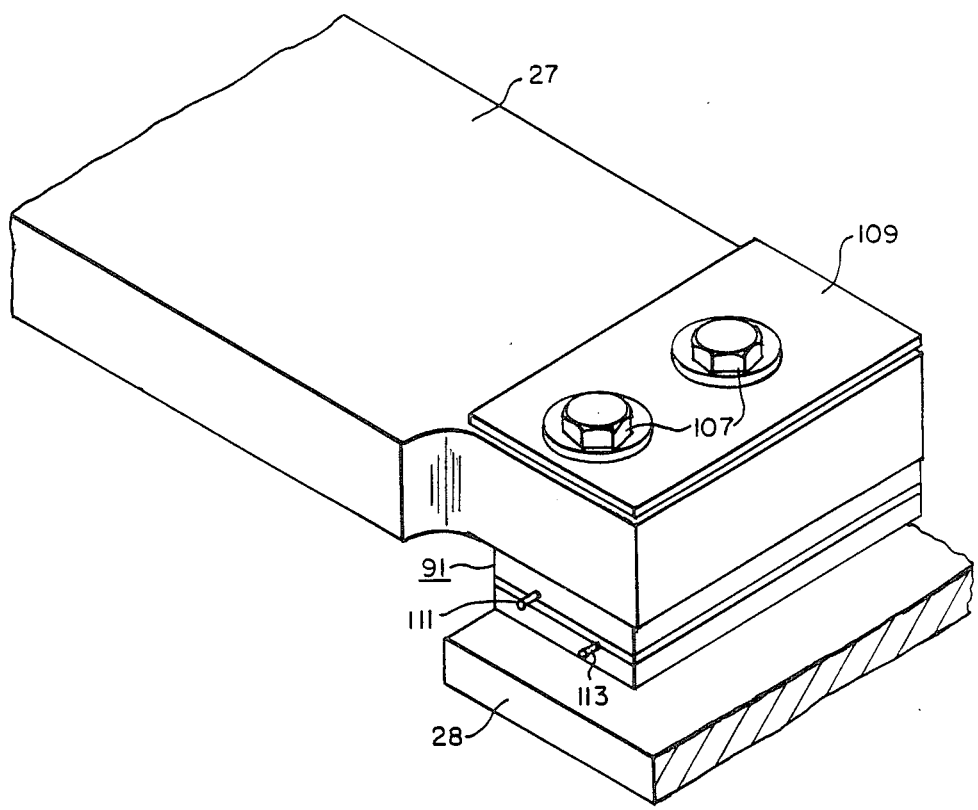
FIG. 2 is enlarged fragmentary perspective view of the overlapping ends of two conductors with a current measuring sensor mounted therebetween.

The conductors 93, 95 provide a uniform contact to the much higher resistivity of the intermediate element 97. This uniform contact facilitates current flowing over the entire cross-sectional area of the shunt or sensor 91. After the copper conductors 93, 95 are brazed to the intermediate element 97, the edges of the shunt or sensor 91 are machined. Mounting holes 103, 105 are drilled to enable the mounting of the sensor in place by bolts 107 between the overlapping end portions of the conductors 27, 28, whereby the assembly of the conductors 27, 28 and the sensor 91 are held together in a compressive status. To avoid shorting of current through the bolts 107 between the conductors 27, 28, an insulating sheet 109 is disposed between the bolts and one of the conductors such as the conductor 27 (FIG. 2). In addition, the shaft of each bolt is enclosed within a cylindrical insulator extending through the holes 103, 105, which are aligned with corresponding holes in the conductors 27, 28. Accordingly, all current passing between the conductors 27, 28 passes through the intermediate element 97.

Inasmuch as oxidation of the exposed edges of the element 97 cause variations in the voltage drop across the shunt, the entire surface of the shunt is coated with an oxide preventative.

Figure 3:
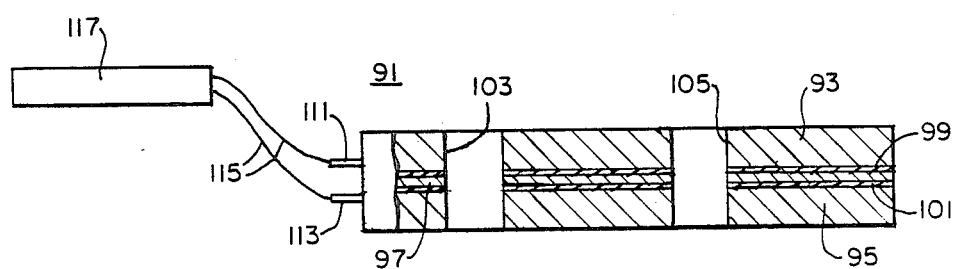
FIG. 3 is a schematic view illustrating the electrical connection between the current measuring sensor (shown in cross-section) and an electronic metering circuit.

A pin 111 is mounted in and extends from one end of the conductor 93. Similarly, another pin 113 is mounted in and extends from the end of the conductor 95. The pins 111, 113 are disposed at a location in the corresponding conductors 91, 95 near the intermediate element 97. Similar potential wires 115 extend from the terminals 111, 113 to an electronic metering circuit 117 (FIG. 3). The terminal pins 111, 113 are voltage sensing points to measure the voltage drop across the intermediate element 97. Copper has a positive temperature coefficient. The manganin intermediate element 97 has a negative temperature coefficient above 50° C. and a positive temperature coefficient below 50° C.

A typical manganin current shunt or current measuring sensor 91 is about 2 inches long, 1.25 inches wide and about ½ inch thick with a manganin intermediate element 97 of about 84 mils. For example, for a 2500 A current shunt design an 84 mil thick manganin element with a 2.4 in² area was used. The resistance of the manganin is:

$$R = \rho \frac{lm}{A}$$

where $\rho$ is $15 \times 10^{-6} \Omega\text{-in}^2/\text{in}$, lm is the shunt length in inches and A is the cross-sectional area in square inches. Six shunts were constructed having the above dimensions and the potential drop was found to be 2.0±0.15 mV at 2500 A. The calculated value of resistance for the manganin element is 0.526 μΩ. The resistance measured between the potential terminals of the shunt is 0.8 μΩ. This value includes the resistance of the copper plates and the braze joints. Table 1 shows the data for the six prototype shunts.

TABLE 1

| | Prototype 2 Mv/2500 A Current Shunts | |
|---|---|---|
| Shunt S/N | Potential Drop at 500 A, mV | Potential Drop at 1000 A, mV |
| 1 | 0.392 | 0.778 |
| 2 | 0.385 | 0.765 |
| 3 | 0.390 | 0.774 |
| 4 | 0.389 | 0.770 |
| 5 | 0.394 | 0.780 |
| 6 | 0.419 | 0.833 |

The preliminary data for the 2 mV manganin current shunt indicates that it would be an acceptable method for sensing direct current inside a molded case breaker. The results of testing indicate the new shunts meet all the specifications for a current sensor for the solid-state DC trip unit.

In conclusion, a current shunt is used for sensing direct current inside a molded case circuit breaker with a solid-state trip unit in a manner comparable to the current transformer used for sensing current in an AC circuit breaker with a solid-state trip unit.

What is claimed is:

1. A circuit breaker having a direct-current measuring shunt, comprising:

a housing having line and load terminals;

conductor means extending between the terminals and including a pair of conductors having adjacent end portions;

a circuit breaker structure supported in the housing and including a pair of separable contacts for opening and closing an electric circuit in the conductor means;

an electronic current measuring sensor interconnecting the adjacent end portions of the pair of conductors;

the current measuring sensor including a laminated body having first and second conductors and an intermediate element composed of an electrically resistance alloy having a resistivity of from about 100 nL·m to about 1500 nΩ·m, and having a temperature coefficient of resistance of from about −50 ppm/°C. to about +50 ppm/°C.;

the intermediate element being disposed between and metallurgically bonded to facing sides of the first and second conductors;

the first and second conductors being electrically connected to an electronic metering circuit for measuring the millivolt drop across the intermediate element;

the adjacent end portions of the pair of conductors overlap and the current measuring sensor being disposed between the end portions in good electrical contact therewith;

the first and second conductor blocks consist of a metal selected from the group consisting of aluminum, copper, gold, platinum, and silver;

the first and second conductor blocks consist of copper;

the intermediate element of electrically resistance alloy is a copper-base alloy including at least one metal selected from the group consisting of manganese and nickel-base alloys;

the metallurgical bond between the intermediate element and the first and second conductor blocks is a brazing alloy of high silver content;

each conductor block comprises a potential terminal near the intermediate element, which terminals are electrically connected to the electronic metering circuit; and the current measuring sensor is compression mounted between the first and second conductors.

2. The circuit breaker of claim 1 in which the surface of the sensor is coated with an oxide preventative.

* * * * *